United States Patent
Kellenberger et al.

(10) Patent No.: US 6,820,793 B2
(45) Date of Patent: Nov. 23, 2004

(54) APPARATUS FOR THE TRANSPORT AND EQUIPPING OF SUBSTRATES WITH SEMICONDUCTOR CHIPS

(75) Inventors: Daniel Kellenberger, Lucerne (CH); Guido Suter, Steinhausen (CH)

(73) Assignee: ESEC Trading SA, Cham (CH)

( * ) Notice: Subject to any disclaimer, the term of this patent is extended or adjusted under 35 U.S.C. 154(b) by 113 days.

(21) Appl. No.: 10/209,066

(22) Filed: Jul. 29, 2002

(65) Prior Publication Data

US 2003/0022416 A1 Jan. 30, 2003

(30) Foreign Application Priority Data

Jul. 30, 2001 (CH) .................................... 2001 1435/01

(51) Int. Cl.[7] .......................... B23K 37/04; B23K 1/00; B23K 5/00
(52) U.S. Cl. ........................ 228/49.5; 228/6.2; 228/44.7
(58) Field of Search ........................... 228/6.2, 25, 44.3, 228/44.7, 47.1, 49.5; 414/16, 150–159, 222.03–222.06, 222.13, 586, 235.01–226.02; 269/55, 56, 58–62, 903

(56) References Cited

U.S. PATENT DOCUMENTS

| | | | | |
|---|---|---|---|---|
| 3,928,749 A | * | 12/1975 | Herrmann | 228/4.5 |
| 5,082,165 A | * | 1/1992 | Ishizuka | 228/179.1 |
| 5,186,719 A | * | 2/1993 | Egashira et al. | 29/25.01 |
| 5,264,002 A | * | 11/1993 | Egashira et al. | 29/25.01 |
| 5,372,972 A | | 12/1994 | Hayashi et al. | 437/209 |
| 5,495,661 A | | 3/1996 | Gromer et al. | 29/740 |
| 5,547,511 A | | 8/1996 | Hamuro et al. | 118/423 |
| 5,634,765 A | * | 6/1997 | Miyoshi | 414/811 |
| 5,806,174 A | * | 9/1998 | Itoh | 29/740 |
| 5,899,341 A | * | 5/1999 | Irita | 209/571 |
| 5,951,283 A | | 9/1999 | Ushiki et al. | 432/253 |
| 5,988,481 A | * | 11/1999 | Torihata et al. | 228/49.5 |
| 6,053,234 A | | 4/2000 | Kim et al. | 156/556 |
| 6,526,651 B1 | * | 3/2003 | Hwang | 29/740 |
| 6,557,247 B1 | * | 5/2003 | Lowe | 29/740 |

\* cited by examiner

*Primary Examiner*—Stanley S. Silverman
*Assistant Examiner*—Colleen P. Cooke
(74) *Attorney, Agent, or Firm*—Thelen Reid & Priest LLP; David B. Ritchie

(57) ABSTRACT

An apparatus for the transport and equipping of substrates with semiconductor chips comprises a channel with two side walls in which the substrates are transported in a transport direction. The apparatus has at least one comb which can be raised and lowered in order to move the substrates in transport direction as well as resiliently mounted elements which press against the substrates.

6 Claims, 2 Drawing Sheets

APPARATUS FOR THE TRANSPORT AND EQUIPPING OF SUBSTRATES WITH SEMICONDUCTOR CHIPS

PRIORITY CLAIM

Figure 1:
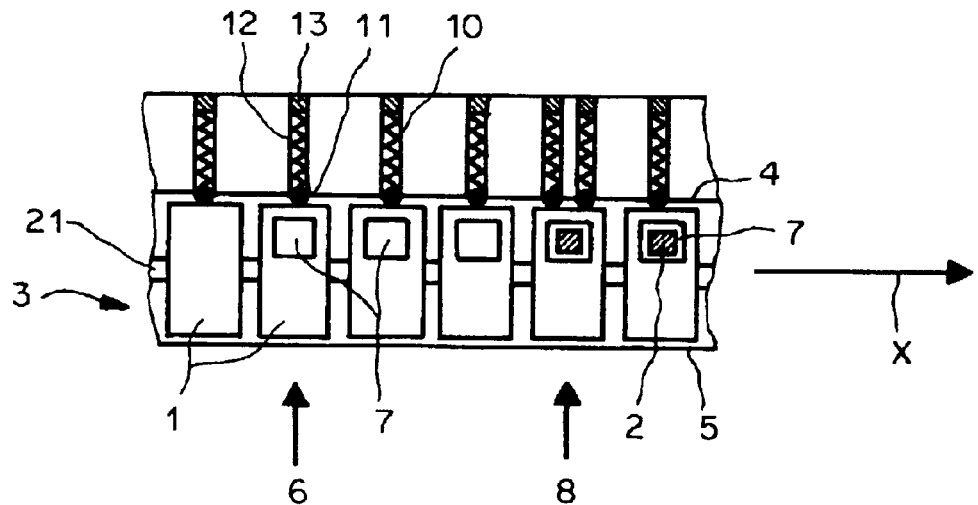

The present application claims priority under 35 U.S.C § 119 based upon Swiss Patent Application No. 2001 1435/01 filed on Jul. 30, 2001.

FIELD OF THE INVENTION

The invention concerns an apparatus for the transport and equipping of substrates with semiconductor chips.

With the mounting of semiconductor chips, it is customary to connect the semiconductor chips, mainly power semiconductors, to the substrate by means of soft solder in order to guarantee an effective dissipation of the heat loss from the semiconductor chip occurring during operation via the solder connection.

As substrates, metal substrates, so-called leadframes, are mainly used where the semiconductor chips are soldered onto chip islands arranged one after the other or, optionally, next to each other. The leadframe is fed in cycles to a soldering station where the solder is applied and then to a bonding station where the semiconductor chip is placed onto the liquid solder by a Pick and Place system. The leadframe has holes arranged along its longitudinal edge into which pins engage during transport of the leadframe. A Die Bonder suitable for this process is marketed by the applicant under the designation 2007 SSI.

Single position substrates, so-called singulated substrates, are also used. Such a single position substrate comprises, for example, a ceramic chip which is covered on both sides with a metal layer. Mounting of the semiconductor chips takes place manually in that a preformed portion of solder, a so-called solder preform, is first placed on the single position substrate and then the semiconductor chip is placed onto the solder portion. Afterwards, the entire composite is hard-soldered in an oven. A semiautomatic assembly process is also known with which, instead of a preformed solder portion, solder in the form of paste is applied mechanically to the single position substrate. Afterwards, the single position substrates are manually equipped with the semiconductor chip and again hard-soldered in an oven.

The object of the invention is to develop an apparatus with which single position substrates can be equipped fully automatically.

BRIEF DESCRIPTION OF THE INVENTION

An apparatus in accordance with the invention for the transport and equipping of single position substrates with semiconductor chips has a channel with two side walls in which the single position substrates are transported in a transport direction. Feeding of the single position substrate takes place by means of toothed combs which can be raised and lowered and moved back and forth whereby each tooth moves one single position substrate forwards. Elements, resiliently-mounted in one of the side walls of the channel, have the effect that the single position substrates are pressed against the other side wall so that they are not swept away by the flow of inert gas prevailing in the channel.

The apparatus can also be set up for the transport of leadframes.

BRIEF DESCRIPTION OF THE DRAWING FIGURES

The accompanying drawings, which are incorporated into and constitute a part of this specification, illustrate one or more embodiments of the present invention and, together with the detailed description, serve to explain the principles and implementations of the invention. The figures are not to scale.

Figure 2:
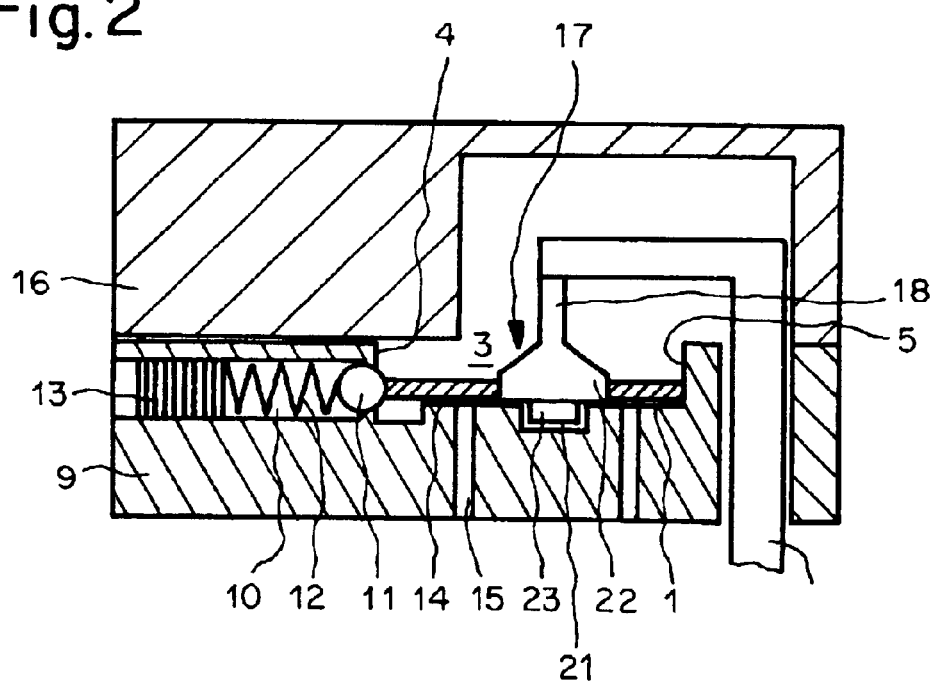
Figure 3A:
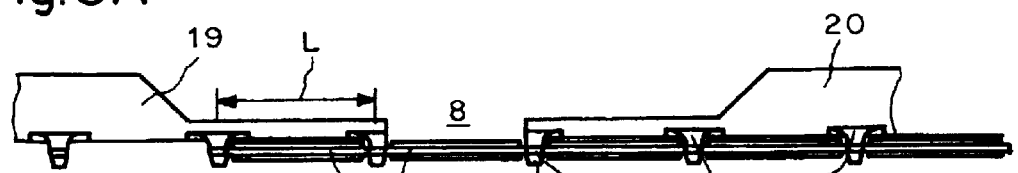
Figure 4:
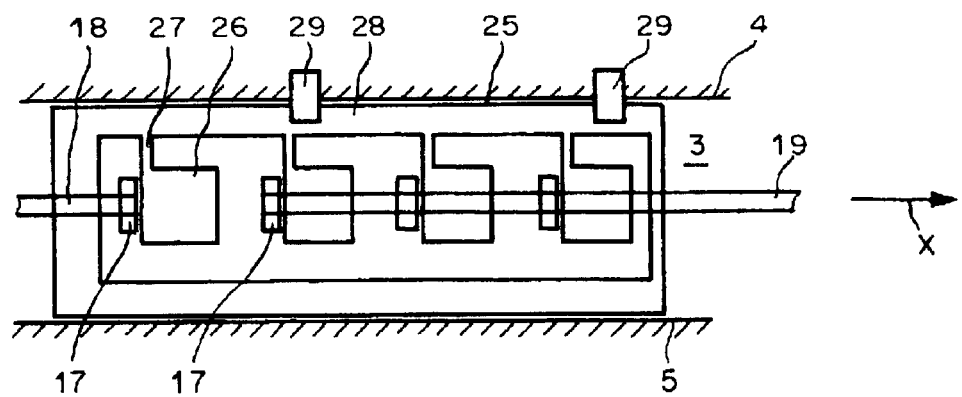

In the drawings:

FIG. 1 shows a plan view of an apparatus for the equipping of single position substrates, FIG. 2 shows a cross-section of the apparatus at right angles to the transport direction, FIGS. 3A, B show different phases of the transport process, and FIG. 4 shows a plan view of an apparatus for the equipping of leadframes.

FIG. 1 shows an apparatus for the equipping of single position substrates 1 with semiconductor chips 2. The single position substrates 1 are transported in cycles in a transport direction x in a rectangular channel 3 with two side walls 4 and 5. A portion of solder 7 is applied at a soldering station 6 in accordance with the process, for example, described in the European patent application EP 852983. Afterwards, a semiconductor chip 2 is placed on the portion of solder 7 at a bonding station 8. A predetermined temperature profile is created in the channel 3 by way of not presented means so that the semiconductor chip 2 is hard-soldered to the single position substrate 1 via the portion of solder 7.

FIG. 2 shows a cross-section of the channel 3 at right angles to the transport direction x. The channel 3 is formed as a rectangular depression in a removable metallic plate 9. The metallic plate 9 has drill holes 10 arranged at periodic intervals which run at right angles to the transport direction x and which open out into the side wall 4 of the channel 3. The other side wall 5 of the channel 3 is formed as a flat surface. Each drill hole 10 contains a ball 11, a spring 12 and a headless screw 13. The drill hole 10 is narrowed on the side facing towards the side wall 4 so that the ball 11 can not fall out of the drill hole 10. The spring 12 presses the ball 11 against the side wall 4 whereby the ball 11 protrudes out of the drill hole 10 into the channel 3. When a single position substrate 1 arrives in the area of the ball 11, then, on the one hand, the resiliently mounted ball 11 presses the single position substrate 1 against the side wall 5 and, on the other hand, the single position substrate 1 brought to a stop on the side wall 5 presses the ball 11 into the drill hole 10. Inert gas is applied to the channel 3 via drill holes 15 introduced into its floor 14. The inert gas flows in the channel 3 in transport direction x. The channel 3 is covered at the top with a plate 16. The plate 16 is however open in the area of the soldering station 6 and in the area of the bonding station 8.

The single position substrates 1 are fed in cycles in transport direction x by three combs 18, 19 and 20 equipped with teeth 17. (The combs 19 and 20 are only presented in FIGS. 3A and 3B.) The first comb 18 transports the single position substrates 1 as far as the soldering station 6 (FIG. 1) where the solder is applied. The second comb 19 transports the single position substrates 1 from the soldering station 6 to the bonding station 8 where the semiconductor chip is lowered onto the solder portion. The third comb 20 transports the single position substrates 1 further up to the end of the channel 3. The single position substrates 1 rest on the floor 14 of the channel 3 and are secured laterally by means of the spring-loaded balls 11 so that they are not carried away by the flow of the inert gas.

The floor 14 of the channel 3 has a groove 21 arranged roughly in the middle and running in transport direction x. The teeth 17 have wings 22 which come to rest on the floor 14 of the channel 3 while an extension 23 of the teeth 17 projects into the groove 21. The extension 23 is formed tapered towards its tip.

Figure 3B:
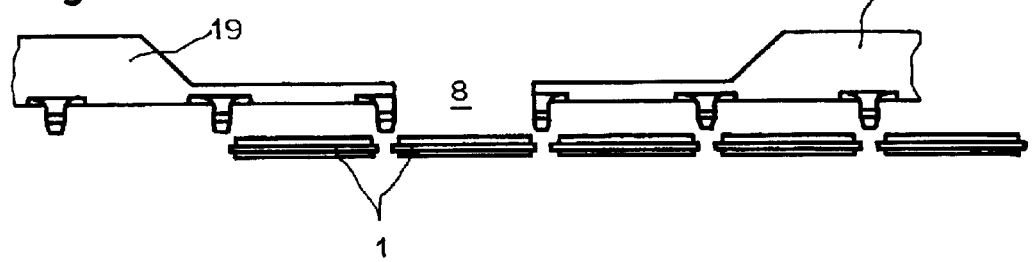

For the cyclic feed of the single position substrates 1, the three combs 18, 19 and 20 are actuated by a common drive mechanism 24 in accordance with the sequence shown in FIGS. 3A and 3B. At the start of a cycle, the combs 18, 19 and 20 are located in a lowered position in which the teeth 17 of the combs 18, 19 and 20 engage between the single position substrates 1 (FIG. 3A) and in which their wings 22 rest on the floor 14 of the channel 3. Prior to the actual assembly phase, the combs 18, 19 and 20 are adjusted to one another in this position and in the heated condition of the apparatus so that the position of the single position substrate 1 which is located at the bonding station is defined practically without play from the first tooth 17 of the second comb 19 and from the last tooth 17 of the third comb 20. In this position, the single position substrate 1 at the bonding station is now equipped with a semiconductor chip and a new single position substrate 1 is introduced at the entrance to the channel 3 and fed forward until it knocks against the rearmost tooth 17 of the first comb 18. In this way, its distance to the foremost single position substrate 1 is defined. Afterwards, the three combs 18, 19 and 20 are raised (FIG. 3B), moved backwards by one feed length L, lowered again whereby the tapered extensions 23 of the teeth 17 engage in the spaces between the single position substrates 1 and fed forward by the feed length L in the lowered condition. In doing so, the teeth 17 feed the single position substrates 1 forwards in transport direction x whereby the single position substrates 1 slide along the floor 14 (FIG. 2) of the channel 3. When the combs 18, 19 and 20 are raised (FIG. 3B), the single position substrates 1 are pressed against the side wall 5 by the spring-loaded balls 11 and are therefore held in their positions. The single position substrates 1 are presented as ceramic chips coated on both sides with a conductive layer.

With typical dimensions of the single position substrates 1 of 3–5 cm, wings 22 with a width of 4–8 mm have proved successful so that the single position substrates 1 do not become skewed on forward feeding. The drill holes 10 are arranged at the distance of the feed length L. That means, that in the raised condition of the combs 18–20, each single position substrate 1 is firmly held by a spring-loaded ball 11. At the bonding station 8 however, it is preferable to have two drill holes 10 with balls 11 so that the single position substrate 1 to be equipped with a semiconductor chip is pressed flush against the side wall 5.

FIG. 4 shows an apparatus designed for the feeding of leadframes 25 as far as is necessary for the understanding of the invention. Each leadframe 25 contains several chip islands 26 arranged one after the other which are connected to the frame 28 of the leadframe 25 by at least one gate 27. The teeth 17 of the combs 18, 19 and 20 (not presented) engage with the chip islands 26 and thereby move the chip islands 26 forwards. In order that the leadframe 25 is not carried away by the gas flow predominating in the channel 3 with the combs 18, 19 and 20 in the raised condition, resiliently mounted, for example as in the former embodiment spring-loaded, rollers 29 are foreseen which press the frame 28 of the leadframe 25 against the floor of the channel 3.

What is claimed is:

1. An apparatus for the transport and equipping of substrates with semiconductor chips, the apparatus comprising:
   a channel with two side walls,
   at least one comb with at least one tooth,
   a drive mechanism for raising, moving backward, lowering and moving forward the at least one comb, whereby the at least one comb pushes the substrates through the channel in a transport direction when the at least one comb is in its lowered position,
   resiliently mounted elements which press against the substrates.

2. The apparatus according to claim 1, wherein the resiliently mounted elements are supported in one of the side walls of the channel for pressing the substrates against the other side wall.

3. The apparatus according to claim 1, wherein the resiliently mounted elements press the substrates against a floor of the channel.

4. The apparatus according to claim 1, the apparatus further comprising a soldering station and a bonding station, wherein the number of combs is three, whereby the first comb transports the substrates as far as the soldering station, whereby the second comb transports the substrates from the soldering station to the bonding station, and whereby the third comb transports the substrates away from the bonding station.

5. The apparatus according to claim 2, the apparatus further comprising a soldering station and a bonding station, wherein the number of combs is three, whereby the first comb transports the substrates as far as the soldering station, whereby the second comb transports the substrates from the soldering station to the bonding station, and whereby the third comb transports the substrates away from the bonding station.

6. The apparatus according to claim 3, the apparatus further comprising a soldering station and a bonding station, wherein the number of combs is three, whereby the first comb transports the substrates as far as the soldering station, whereby the second comb transports the substrates from the soldering station to the bonding station, and whereby the third comb transports the substrates away from the bonding station.

* * * * *